United States Patent [19]

Noda et al.

[11] Patent Number: 4,847,844
[45] Date of Patent: Jul. 11, 1989

[54] SURFACE-EMITTING SEMICONDUCTOR LASER DEVICE

[75] Inventors: Susumu Noda; Keisuke Kojima; Kazuo Kyuma, all of Hyogo, Japan

[73] Assignee: Mitsubishi Denki Kabushiki Kaisha, Tokyo, Japan

[21] Appl. No.: 148,475

[22] Filed: Jan. 26, 1988

[30] Foreign Application Priority Data

Feb. 23, 1987 [JP] Japan .................................. 62-39665

[51] Int. Cl.$^4$ ......................... H01S 3/19; H01L 33/00
[52] U.S. Cl. ........................................ 372/45; 357/16; 357/17; 372/46; 372/49; 372/96
[58] Field of Search ...................... 372/45, 46, 49, 96; 357/16, 17

[56] References Cited

FOREIGN PATENT DOCUMENTS 0168980  7/1986  Japan .................................. 372/45
0189685  8/1986  Japan .................................. 372/45

Primary Examiner—William L. Sikes
Assistant Examiner—Georgia Y. Epps
Attorney, Agent, or Firm—Sughrue, Mion, Zinn, Macpeak & Seas

[57] ABSTRACT

A surface-emitting semiconductor laser device comprises a first electrode, a first-conductivity-type clad layer provided on the first electrode, an active layer provided on the first-conductivity-type clad layer, a guide layer provided on the active layer and having an even-numbered-order diffraction grating opposite to the active layer, a second-conductivity-type clad layer provided on the guide layer, contact layers provided on portions of the second-conductivity-type clad layer, and second electrodes provided on the contact layers.

16 Claims, 3 Drawing Sheets 4,847,844

SURFACE-EMITTING SEMICONDUCTOR LASER DEVICE

BACKGROUND OF THE INVENTION

The present invention relates to a surface emitting semiconductor laser device.

FIG. 1 shows a sectional view of a conventional surface-emitting semiconductor laser device disclosed in pages 930 to 932 of the journal "Applied Physics Letters"vol. 46, No. 10, 1985. The device comprises a first electrode 1, a substrate 2 such as an n-type InP substrate, a buffer layer 3 such as an n-type GaInAsP. buffer layer, a first clad layer 4 such as an n-type InP clad layer, an active layer 5 such as a p-type GaInAsP active layer which has a thickness of several microns, a second clad layer 9 such as a p-type InP clad layer, reflectors 14 and 15, an insulating film 16 of $SiO_2$ or the like, an opening 17 provided on the top of the device, and a second electrode 18. The substrate 2 and the buffer layer 3 are interposed between the first electrode 1 and the first clad layer 4. The opening 17 is provided over the first clad layer 4 to take out a laser beam from the top of the device.

The operation of the device will be described. When an electrical current is caused to flow between the first and the second electrodes 1 and 18, light emerges from the active layer 5 and is reflected by the upper and the lower reflectors 14 and 15 so that Fabry-Perot laser oscillation arises in a resonator constituted by the reflectors. The laser beam is taken out through the opening 17 provided on the top of the device. The thickness of the active layer 5 is about several microns, and the length of the resonator constituted by the reflectors 14 and 15 is also about several microns.

Since the conventional surface-emitting semiconductor laser device shown in FIG. 1 is constituted as described above, the length of the resonator is very short and the loss in the resonator is very large. When the reflectivity R of the upper and the lower reflectors 14 and 15 is 70% and the length L of the resonator is $7\mu$, for example, the loss in the resonator is about 450 $cm^{-1}$. For that reason, the threshold current of the device is so high that the device cannot be normally used. Also, since the construction around the reflector 15 included in the device is complicated and the length of the resonator is short, the process of manufacturing of the device is complicated.

FIG. 2 shows a cutaway perspective view of another conventional surface-emitting semiconductor laser device disclosed in "GaInAsP/InP integrated laser with butt jointed built-in distributed-Bragg-reflector waveguide" by Y. Abe, K. Kishino, Y. Suematsu and S. Arai in the journal "Electronics Letters" vol. 17, Nos. 25/26, pages 945 to 947, December 1981. The device comprises an active region 59, a Bragg reflection region 60, an n-type electrode 62, an n-type InP substrate 63, a single active layer 64 of InGaAsP and about $0.1\mu$ in thickness, a clad layer 65 of p-type InP, a contact layer 66 of p-type InGaAsP, an insulating film 67 of $SiO_2$, a p-type electrode 68, an optical waveguide layer 69 of InGaAsP, a clad layer 70 of InP, an embedded layer 71 of p-type InP, an embedded layer 72 of n-type InP, and a diffraction grating 73. The gap wavelength $\lambda_{ga}$ of the active layer 64 is about $1.62\mu$, while that $\lambda_{ga}$ of the optical waveguide layer 69 is about $1.35\mu$.

The operation of the device will be described. When an electrical current is caused to flow between the electrodes 62 and 68 in the active region 59, light is amplified by the active layer 64. The gap wavelength $\lambda_{ga}$ of the optical waveguide layer 69 is smaller than that $\lambda_{ga}$ of the active layer 64, that is, the optical waveguide layer is made of such a substance that the optical waveguide layer does not absorb the light at the laser oscillation wavelength. Therefore, the light is transmitted in the optical waveguide layer 69 without being absorbed and is reflected by the diffraction grating 73, so that the light is reciprocated between the Bragg reflection region 60 and the plane of cleavage of the active region 59 while being amplified by the active region. As a result, laser oscillation is caused. Since the diffraction grating 73 is of wavelength selectivity, the laser oscillation is caused in a stable single mode.

Since the conventional surface-emitting semiconductor laser device shown in FIG. 2 is constituted as described above, when the device is manufactured, the layers except the electrodes in the active region 59 are provided on the substrate 63 by crystal growth, a region corresponding to the Bragg reflection region 60 is thereafter removed by etching or the like and the optical waveguide layer 69 and the clad layer 70 are provided in the removed region by crystal growth. For that reason, at least two steps of crystal growth are needed, so that the process of the manufacturing is complicated and the yield thereof is low. Further, a loss of light at the joint of the active region 59 and the Bragg reflection region 60 is large.

SUMMARY OF THE INVENTION

The present invention was made in order to solve the above-mentioned problems of the conventional surface-emitting semiconductor laser devices.

Accordingly, it is an object of the present invention to provide a surface-emitting semiconductor laser device having a low threshold current. The surface-emitting semiconductor device comprises a first electrode, a first-conductivity-type clad layer provided on the first electrode, an active layer provided on the first-conductivity-type clad layer, a guide layer provided on the active layer and having an even-numbered-order diffraction grating opposite the active layer, a second-conductivity-type clad layer provided on the guide layer, contact layers provided on portions of the second-conductivity-type clad layer, and second electrodes provided on the contact layers. The even-numbered-order diffraction grating acts so that light is also emitted perpendicularly to the active layer. The second-conductivity-type clad layer has a laser beam takeout portion to constitute the surface-emitting semiconductor laser device. Since a resonator is constituted by both the end faces of the device and the diffraction grating, the length of the resonator is larger than that in the conventional surface-emitting semiconductor laser device, so that the threshold current of the device provided in accordance with the present invention can be lowered.

It is another object of the present invention to provide a surface-emitting semiconductor laser device having a low threshold current, which is manufactured more easily than the conventional surface-emitting semiconductor laser device and is improved in yield of manufacturing and in which the loss of light at the joint of an active region and a Bragg reflection region is reduced. The surface-emitting semiconductor laser device comprises a first electrode, a first-conductivity-type clad layer provided on the first electrode, an active layer provided on the first-conductivity-type clad layer, a second-conductivity-type clad layer provided on the active layer, an even-numbered-order diffraction grating provided on a portion of the second-conductivity-type clad layer opposite to the active layer, and a second electrode provided on the other portion of the second-conductivity type clad layer opposite to the active layer, so that the part of the device with the diffraction grating and the other part of the device with the second electrode are used as the Bragg reflection region and the active region, respectively. As a result, an active layer and an optical waveguide layer can be constituted by the same active layer, and the Bragg reflection region and the active region are constituted by a continuous layer. The absorption loss in the optical waveguide layer is very small at the wavelength at which the active layer has the maximum gain, so that reflection is effectively performed by the Bragg reflection region. Since a resonator is constituted by one end face of the device and the diffraction grating, the length of the resonator becomes large and the threshold current of the device can be lowered.

DETAILED DESCRIPTION OF THE PREFERRED EMBODIMENTS

Embodiments of the present invention will now be described in detail with reference to the drawings attached hereto.

Figure 3:
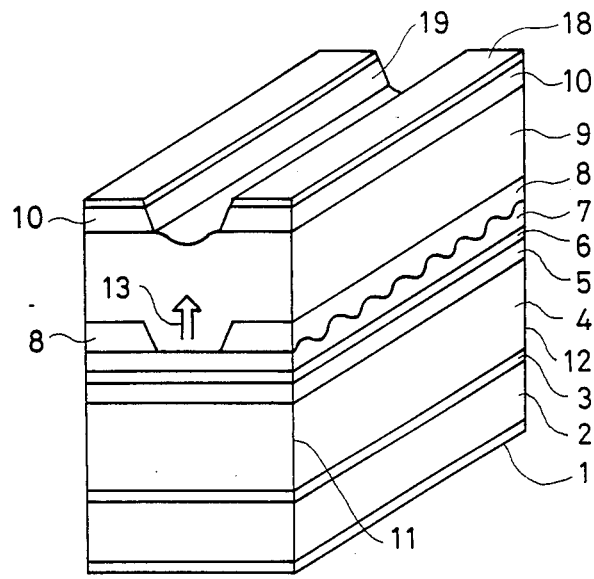
FIG. 3 is a perspective view of a surface-emitting semiconductor laser device according to an embodiment of the present invention.

FIG. 3 shows a perspective view of a surface-emitting AlGaAs/GaAs semiconductor laser device according to one embodiment of the present invention, which comprises a first electrode 1, an n-type GaAs substrate 2 of about 80$\mu$ in thickness, a buffer layer 3 of n-type GaAs and about 0.2$\mu$ in thickness, a first clad layer 4 of n-type $Al_xGa_{1-x}As$ (x=0.3) and about 1.5$\mu$ in thickness, an n-type GaAs active layer 5 having a thickness of about 0.1 $\mu$ and containing no additives, a buffer layer 6 of p-type $Al_xGa_{1-x}As$ (x=0.25) and about 0.2$\mu$ in thickness, a p-type $Al_xGa_{1-x}As$ (x=0.1) optical guide layer 7 having an average thickness of about 0.14 $\mu$ and provided with an even-number-order (such as secondary) diffraction grating opposite to the active layer 5, current constriction layers 8 of n-type GaAs and about 0.5$\mu$ in thickness, a second clad layer 9 of p-type $Al_xGa_{1-x}As$ (x=0.3) and about 1.5$\mu$ in thickness, contact layers 10 of $p^+$—-type GaAs and about 0.5$\mu$ in thickness, end faces 11 and 12 of the laser device, second electrodes 18, and a laser beam takeout portion 19 provided on the second clad layer to take out a laser beam 13 perpendicularly to the active layer. In the device, the transverse confinement of light is attained by a self-aligned structure (hereinafter referred to as SAS).

When an electrical current is caused to flow between the first and the second electrodes 1 and 18, carriers are injected into the active layer 5 so that light emerges. Only the portion of the light, which corresponds to the period of the diffraction grating of the guide layer 7, is selectively amplified so that laser oscillation is caused. Normally, the laser beam is taken out from both the end faces 11 and 12. However, when the diffraction grating is an even-numbered-order one, the laser beam is also emitted perpendicularly to the active layer 5, as shown at 13 in FIG. 3. Since the energy gap of the second clad layer 9 is normally larger than the energy of the laser beam, the second clad layer is transparent for the laser beam. Since the energy gap of the contact layers 10 is nearly equal to the energy of the laser beam, the contact layers absorb the laser beam. However, since the contact layers 10 are not provided on the laser beam takeout portion 19, the laser beam 13 emitted perpendicularly to the active layer 5 is easily transmitted in its direction, so that the laser beam can be taken out in the surface direction. Since the principle of the laser oscillation in the device is the same as that in a conventional distribution feedback semiconductor laser, the length of the resonator of the device provided in accordance with the present invention is larger than that of the resonator of the conventional device and the threshold current of the device provided in accordance with the present invention is lower than that of the conventional device. If both the end faces 11 and 12 are coated with thin films each made of a number of dielectric substances such as $SiO_2/Al_2O_3$ for high reflection, the amount of the laser beam taken out in the surface direction can be increased and the threshold current can be further lowered. Besides, a semiconductor laser device of smaller spectral line width can be constituted. Since the device provided in accordance with the present invention is of a distribution feedback structure, the device operates in a well-established single mode. Also, since the device does not need a reflector, the process of manufacturing of the device is simpler than that of manufacturing of the conventional device.

Although the transverse confinement of light is performed by the self-aligned structure in the above-described embodiment, the present invention is not limited thereto but may be otherwise embodied so that the transverse confinement of light is performed by a channeled substrate planar (CSP) structure or a buried heterostructure (BH). Besides, the active layer may be of a quantum well structure, and the surface-emitting semiconductor laser device may be made of substances other than AlGaAs/GaAs.

Figure 4:
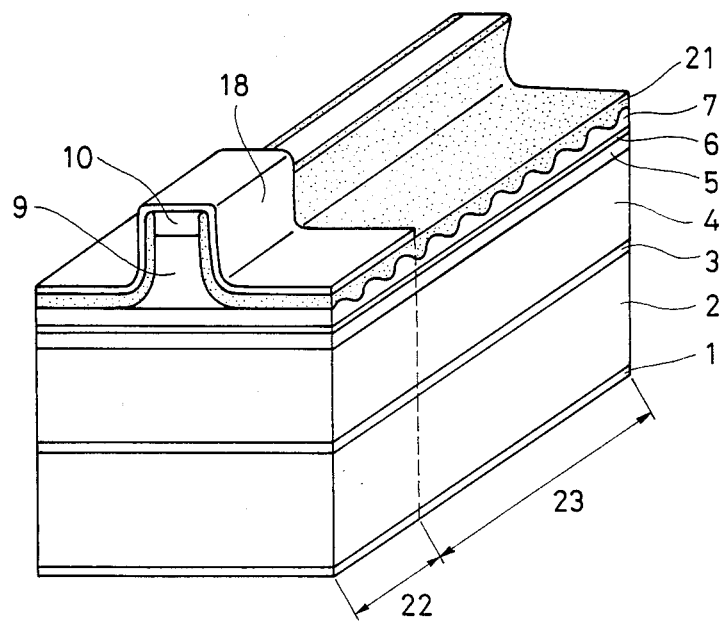
FIG. 4 is a perspective view of a surface-emitting semiconductor laser device according to another embodiment of the present invention.

FIG. 4 shows a perspective view of a surface emitting semiconductor laser device according to another embodiment of the present invention. The same reference numerals in FIGS. 3 and 4 denote the same or equivalent portions. The device comprises a substrate 2, a buffer layer 3, a first-conductivity-type clad layer 4, a multiple quantum well active layer 5, a buffer layer 6, an optical guide layer 7 provided with a secondary diffraction grating, a second-conductivity-type clad layer 9, a contact layer 10 provided near an end face of the device, insulating films 21, a first electrode 1, and a second electrode 18. The contact layer 10 and the second electrode 18 are provided only near the end face of the device so that the device is divided into a current injection part 22 and a current non-injection part 23. The transverse confinement of an electrical current and light is performed by a ridge waveguide structure.

The operation of the surface-emitting semiconductor laser device will be described. When an electrical current is caused to flow between the electrodes 1 and 18, light emerges in the active layer 5 of the current injection part 22. When the light is transmitted in the current injection part 22, only the portion of the light, which has a wavelength determined by the period of the diffraction grating, is amplified so that laser oscillation is caused. The active layer 5 and the optical guide layer 7 in the current injection part 22 all contribute to the laser resonance. Since the laser oscillation is of the distribution feedback type, the stability of the wavelength of a laser beam is very high. The laser light is also transmitted into the current non-injection part 23. Since the active layer 5 is made of a multiple quantum well, if the period of the diffraction grating is set so that a wavelength (Bragg wavelength) determined by the period is larger than that at the peak of gain, the absorption of the laser light in the active layer 5 acting as a waveguide in the current non-injection part 23 is largely reduced so that the laser light deeply enters into the current non-injection part. The laser light having entered into the current non-injection part 23 is subjected to the action of the secondary diffraction grating and is taken out perpendicularly to the direction of initial proceeding of the laser light. In other words, the surface-light-emission arises.

In the device, the active layer 5 and the optical guide layer 7 having the diffraction grating constitute a distribution feedback laser resonator in the current injection part 22 having the contact layer 10. In the current non-injection part 23 not having the contact layer 10, the active layer 5 functions as a waveguide, and the diffraction grating functions as a light emitting portion for taking out the laser beam from the top of the device. Besides, since the active layer 5 is a quantum well layer of low light absorption, the length of the resonator can be made sufficient in accordance with that of the contact layer 10 and a loss can be reduced so that the threshold current of the device can be made very low. Furthermore, since the laser beam is emitted from a wide region in the device, the laser beam in a very narrow range can be taken out from the device.

Since the device of this embodiment does not have a complicated construction such as a reflector of a conventional surface-emitting semiconductor laser device, it can be made more simply than the conventional device. Therefore, the cost of manufacturing of the device is lower than that of manufacturing of the conventional device.

Although the period of the diffraction grating is set in the above-described embodiment so that the Bragg wavelength determined by the period is larger than that at the peak of gain, the present invention is not limited thereto but may be otherwise embodied so that the period of the diffraction grating is set to make the Bragg wavelength smaller than that at the peak of gain of the active layer to increase the absorption of the laser light in the active layer 5 of the current non-injection part 23. In the latter case, when the output of the laser light emerging in the current injection part 22 is small, almost all of the laser light transmitted into the current non-injection part is absorbed in the active layer and does not deeply enter into the current non-injection part, so that the quantity of the laser light taken out from the top of the device is small. When the output of the laser light emerging in the current injection part increases, the absorption of the laser light in the active layer is gradually saturated so that the quantity of the laser light emitted from the top of the device increases abruptly. Once the absorption is saturated, the quantity of the laser light emitted from the top of the device remains large for a while even if the output of the laser light emerging in the current injection part decreases. In other words, the quantity of the laser light emitted from the top of the device becomes hysteretic. Thus, a bistable surface-emitting semiconductor laser device can be constituted.

Figure 5:
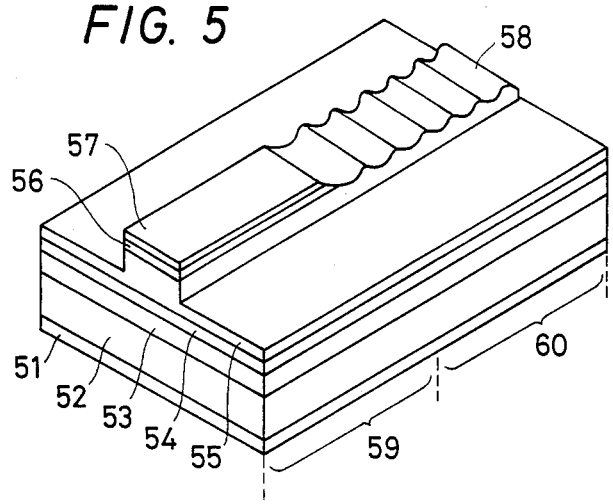
FIG. 5 is a perspective view of a surface-emitting semiconductor laser device according to still another embodiment of the present invention.

FIG. 5 shows a perspective view of a surface-emitting semiconductor laser device according to still another embodiment of the present invention and in which the transverse confinement of laser light is performed by a ridge waveguide structure. The device comprises a first electrode 51 such as an n-type electrode, a substrate 52 such as an n-type GaAs substrate, a first-conductivity-type clad layer 53 such as an n-type AlGaAs layer, a quantum well active layer 54 such as an AlGaAs/GaAs layer of 200 Å or less in thickness, a second-conductivity-type clad layer 55 such as a p-type AlGaAs layer of 200 Å or less in thickness, a contact layer 56 such as a p-type GaAs layer, a second electrode 57 such as a p-type electrode, and an even-numbered-order diffraction grating 58 provided on a portion of the second-conductivity-type clad layer 55 opposite to the quantum well active layer 54 so as to constitute a Bragg reflection region 60, from which a surface-emitted beam is obtained. The p-type electrode 57 is provided at the other portion of the second-conductivity-type clad layer 55 so as to constitute an active region 59.

Figure 6:
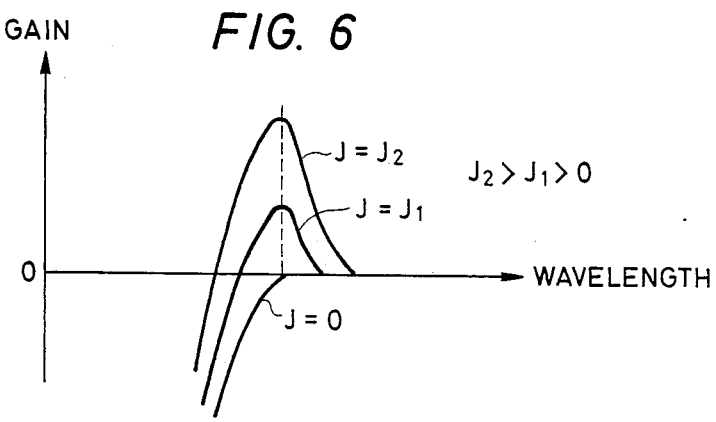
FIG. 6 is a characteristic diagram showing the relationship between the injected current and gain spectrum for a quantum well layer of the surface-emitting semiconductor device shown in FIG. 5.

FIG. 6 shows the change in gain spectrum when an injected current is increased for a general quantum well active layer, with the axis of abscissa indicating wavelength and the axis of ordinate indicating gain. When the injected current is zero, namely, the density J ($kA/cm^2$) of the injected current is zero, the relationship between the wavelength and the gain is shown in FIG. 6 by a curve indicating a negative gain, which means that only absorption takes place. However, when the injected current is increased to a density $J_1$ or $J_2$ ($J_2 > J_1$), a positive gain is obtained as shown by another curves in FIG. 6. When light having gain peak wavelength shown by a dotted line in FIG. 6 passes through a region into which no current is injected, the absorption coefficient thereof is very small as shown by the curve for the density $J=0$.

In the active region 59 shown in FIG. 5, an electrical current is injected in a striped manner between the electrodes 51 and 57 so that a gain is obtained in the quantum well active layer 54. In the Bragg reflection region 60, only light of prescribed wavelength is reflected by the diffraction grating 58. The absorption of light in the quantum well active layer 54 into which the electrical current is not injected is very small and the efficiency of the reflection is very high. If the period of the diffraction grating 58 is set so as to make the wavelength in laser oscillation larger than that at the peak of gain, the absorption of light is made smaller so that the efficiency of the reflection can be made higher.

In the surface-emitting semiconductor laser device shown in FIG. 5, the transverse confinement of light is performed by the ridge waveguide structure in which a stepped portion is provided to make a difference in effective refractive index to perform the transverse confinement of light.

Figure 1:
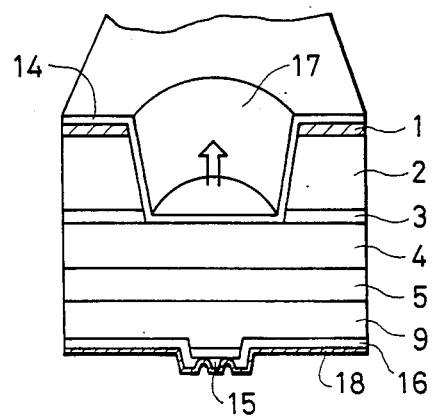
FIG. 1 is a sectional view of a conventional surface-emitting semiconductor laser device.
Figure 2:
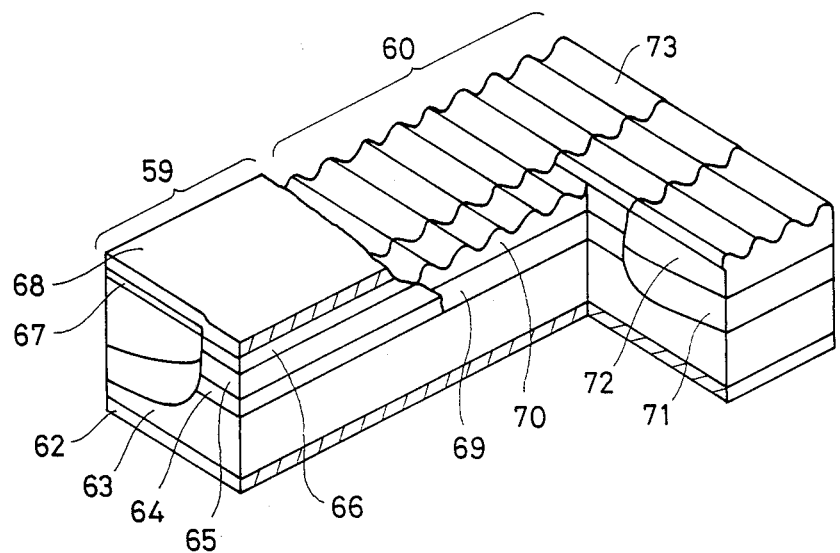
FIG. 2 is a cutaway perspective view of another conventional surface-emitting semiconductor laser device.

Since the quantum well active layer 54 functions as an active layer in the active region 59 and as an optical waveguide layer in the Bragg reflection region 60, the manufacturing of the surface-emitting semiconductor laser device does not need two times of crystal growth as that of the conventional surface-emitting semiconductor laser device shown in FIG. 2. Therefore, the process of the manufacturing of the device shown in FIG. 5 is simplified, and the yield thereof is enhanced. Besides, the loss of light at the joint of the active layer and the optical waveguide layer can be prevented from increasing.

Figure 7:
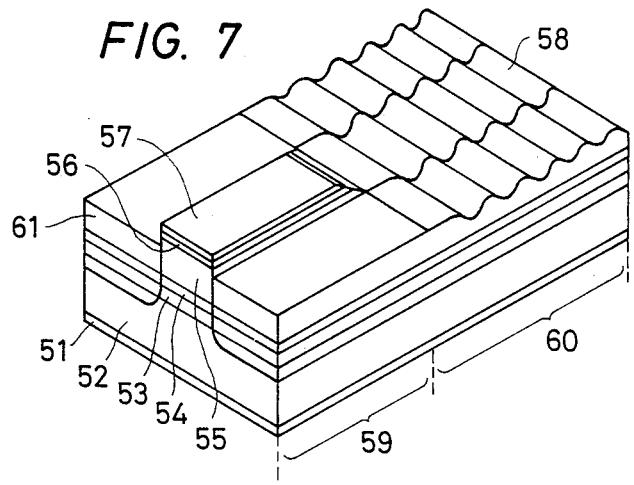
FIG. 7 is a perspective view of a surface-emitting semiconductor laser device according to still another embodiment of the present invention.

Although the transverse confinement of light is performed by the ridge waveguide structure in the embodiment shown in FIG. 5, the present invention is not limited thereto but may be otherwise embodied so as to diffuse an impurity such as Zn and Si into a portion except for an optical waveguide to make a difference in refractive index. FIG. 7 shows such a modified embodiment in which an impurity is diffused into a portion 61. Since the refractive index of the impurity-diffused portion in a quantum well active layer 54 is lowered, the transverse confinement of light is enabled by the difference in refractive index.

Since the surface-emitting semiconductor laser device is basically of a distributed reflector laser structure, the resonator loss of the device is low enough and the laser oscillation of low threshold level becomes possible.

As described above, according to an embodiment of the present invention, the surface-emitting semiconductor device comprises a first electrode, a first-conductivity-type clad layer provided on the first electrode, an active layer provided on the first-conductivity-type clad layer, a guide layer provided on the active layer and having an even-numbered-order diffraction grating opposite to the active layer, a second-conductivity-type clad layer provided on the guide layer, contact layers provided on portions of the second-conductivity-type clad layer, and second electrodes provided on the contact layers. Accordingly, the length of the resonator can be made long and the surface-emitting semiconductor laser device having a low threshold current and a well-established single mode can be obtained. Further, it is easy to manufacture the device. Also, if an appropriate period is selected for the diffraction grating, the device can be constituted as a bistable surface-emitting semiconductor laser device. Accordingly, the device can be used for various purposes.

According to another embodiment of the present invention, a surface-emitting semiconductor laser device comprises a first electrode, a first-conductivity-type clad layer provided on the first electrode, an active layer provided on the first-conductivity-type clad layer, a second-conductivity-type clad layer provided on the active layer, an even-numbered-order diffraction grating provided on a portion of the second-conductivity-type clad layer opposite to the active layer, and a second electrode provided on the other portion of the second-conductivity-type clad layer opposite to the active layer, the part of the device with the diffraction grating and he other part of the device with the second electrode being used as the Bragg reflection region and the active region, respectively. As a result, the active layer and an optical waveguide layer can be constituted by the same active layer so that the process of manufacturing of the device is simple and the yield thereof can be improved. Further, the scatter loss at the joint of the Bragg reflection region and the active region is reduced. Also, the length of the resonator can be made large so that the threshold current of the device can be lowered.

What is claimed is:

1. A surface-emitting semiconductor laser device, comprising:
    a first electrode (1);
    a substrate (2) provided on said first electrode (1);
    a first-conductivity-type clad layer (4) provided over said first electrode;
    an active layer (5) provided on said first-conductivity-type clad layer;
    a guide layer (7) provided over said active layer and having an even-numbered order diffraction grating opposite to said active layer;
    a second-conductivity-type clad layer (9) provided over said diffraction grating in said guide layer and having a laser beam take-out position (19) provided therein;
    contact layers (10) provided on respective portions of said second-conductivity-type clad layer; and
    second electrodes (18) provided on respective ones of said contact layers, wherein end faces of said layers and said diffraction grating constitute a resonator.

2. A surface-emitting semiconductor laser device according to claim 1, wherein said active layer is of a quantum well structure.

3. A surface-emitting semiconductor laser device according to claim 1, further comprising a highly reflective coating provided over said end faces of each of said layers.

4. A surface-emitting semiconductor laser device according to claim 1, wherein the horizontal transverse confinement of light is performed by a self-aligned structure.

5. A surface-emitting semiconductor laser device according to claim 1, wherein the horizontal transverse confinement of light is performed by a ridge waveguide structure.

6. A surface-emitting semiconductor laser device according to claim 2, wherein the horizontal transverse confinement of light is performed by a ridge waveguide structure.

7. A surface-emitting semiconductor laser device according to claim 5, wherein a period of said diffraction grating is such that a Bragg wavelength determined by said period is larger than a wavelength at the peak of gain.

8. A surface-emitting semiconductor laser device according to claim 5, wherein a period of said diffraction grating is such that a Bragg wavelength determined by said period is smaller than a wavelength at the peak of gain.

9. A surface-emitting semiconductor laser device, comprising:
    a first electrode (51);
    a substrate (52) provide on said first electrode (51);
    a first-conductivity-type clad layer (53) provided on said substrate;
    an active layer (54) provided on said first-conductivity-type clad layer and having a quantum well structure;

a second-conductivity-type clad layer (55) opposite to said active layer;

an even-numbered order diffraction grating (58) provided on a first portion of said second-conductivity-type clad layer opposite to said active layer; and a second electrode (57) provided on a second portion of said second-conductivity-type clad layer opposite to said active layer, wherein said first portion and said second portion comprise a Bragg reflection region (60) and an active region (59), respectively.

10. A surface-emitting semiconductor laser device according to claim 9, wherein a period of said diffraction grating is such that a wavelength of laser oscillation is larger than a wavelength at the peak of gain.

11. A surface-emitting semiconductor laser device according to claim 9, wherein the transverse confinement of light is performed by a ridge waveguide structure.

12. A surface-emitting semiconductor laser device according to claim 10, wherein the transverse confinement of light is performed by a ridge waveguide structure.

13. A surface-emitting semiconductor laser device comprising:

a first electrode (1);

a substrate (2) provided on said first electrode;

a first-conductivity-type clad layer (4) provided over said substrate;

an active layer (5) provided on said first-conductivity-type clad layer, said active layer having a quantum well structure;

a guide layer (7) provided over said active layer and having an even-numbered order diffraction grating opposite said active layer;

a second-conductivity-type clad layer (9) provided on said diffraction grating in said guide layer;

a contact layer (10) provided on a portion of said second conductivity clad layer; and a second electrode (18) provided on said contact layer, wherein end faces of said layers and said diffraction grating constitute a resonator.

14. A surface-emitting semiconductor laser device according to claim 13, wherein a period of said diffraction grating is such that a Bragg wavelength determined by said period is larger than a wavelength at the peak of gain.

15. A surface-emitting semiconductor laser device according to claim 13, wherein a period of said diffraction grating is such that a Bragg wavelength determined by said period is smaller than a wavelength at the peak of gain.

16. A surface-emitting semiconductor laser device according to claim 13, wherein the transverse confinement of light is performed by a ridge waveguide structure.

* * * * *